United States Patent [19]

West

[11] Patent Number: 4,623,611

[45] Date of Patent: Nov. 18, 1986

[54] PHOTOLITHOGRAPHIC STRIPPING METHOD FOR REMOVING CONTRAST ENHANCEMENT LAYER

[75] Inventor: Paul R. West, Clifton Park, N.Y.

[73] Assignee: General Electric Company, Schenectady, N.Y.

[21] Appl. No.: 691,829

[22] Filed: Jan. 16, 1985

[51] Int. Cl.$^4$ .................. G03C 5/00; G03C 11/24; G03F 7/26

[52] U.S. Cl. .................. 430/329; 430/156; 430/166; 430/271; 430/273

[58] Field of Search ............... 430/329, 191, 166, 192, 430/156, 312, 271, 273

[56] References Cited

U.S. PATENT DOCUMENTS

| | | | |
|---|---|---|---|
| 3,725,069 | 4/1973 | Hammond | 430/176 |
| 4,395,348 | 7/1983 | Lee | 430/329 |
| 4,411,978 | 10/1983 | Lavidon et al. | 430/191 |
| 4,578,344 | 3/1986 | Griffing et al. | 430/312 |

FOREIGN PATENT DOCUMENTS 110165  6/1984  European Pat. Off. ............ 430/156

*Primary Examiner*—Charles L. Bowers, Jr.
*Attorney, Agent, or Firm*—William A. Teoli; James C. Davis, Jr.; James Magee, Jr.

[57] ABSTRACT

A method is provided for stripping a contrast enhancement layer from the surface of a photoresist such as a novolak-based resist without substantially altering its characteristic properties for photolithographic applications. The CEL composite photoresist is immersed or treated with toluene or a mixture thereof in a particular manner.

2 Claims, No Drawings

PHOTOLITHOGRAPHIC STRIPPING METHOD FOR REMOVING CONTRAST ENHANCEMENT LAYER

CROSS REFERENCE TO RELATED APPLICATIONS

Reference is made to copending application Ser. No. 536,923, filed Sept. 28, 1983 for Method of Enhancing the Contrast of Images and Materials Therefor which is a continuation-in-part application of Ser. No. 438,194, filed Nov. 11, 1982, now abandoned, assigned to the same assignee as the present invention and incorporated herein by reference. Reference is also made to copending application Ser. No. 684,395, now U.S. Pat. No. 4,578,344, for Photolithographic Method, assigned to the same assignee as the present invention and incorporated herein by reference.

BACKGROUND OF THE INVENTION

As taught in copending application Ser. No. 536,923, significant advantages can be achieved in photolithographic methods by utilizing a contrast enhancement layer (CEL) on a photoresist substrate. For example, an improvement in wall profiles and problems associated with reflections and defraction effects are substantially minimized.

Although valuable results have been achieved from using CEL with photoresist in photolithographic methods, experience has shown that the removal of the CEL residues with organic solvent from the photoresist after the photolithographic composite has been initially exposed, can result in the alteration of the underlying photoresist layer. In some instances, the underlying resist layer can be completely removed, or a relief pattern can be prematurely formed in the photoresist layer prior to its development. Halogenated hydrocarbons, such as trichloroethylene or chlorobenzene, have been found effective if the photolithographic composite is immersed into the solvent for a limited period of time, or if the solvent is applied onto the CEL as a fine spray. However, such halogenated hydrocarbons often are restricted due to environmental regulations.

The present invention is based on the discovery that CEL films can be effectively removed from photolithographic composites without substantially altering the underlying photoresist substrate by treating the surface of the CEL with toluene in the form of a mist or by immersing the photolithographic composite in a mixture of toluene and anisole for periods of up to 3 minutes.

STATEMENT OF THE INVENTION

There is provided by the present invention a photolithographic stripping method which comprises, (1) exposing to patterned UV light, a photoresist comprising a contrast enhancement layer and (2) substantially effecting the complete removal of the contrast enhancement layer from the photoresist without substantially altering or removing photoresist immediately adjacent to the contrast enhancement layer, where the removal of the contrast enhancement layer from the photoresist is effected by spraying the contrast enhancement layer with toluene in the form of a mist or immersing or spraying the contrast enhancement layer with a mixture of toluene and anisole.

Among the photoresists which can be used in the practice of the present invention, for example, are composites consisting of a CEL layer, having a thickness of about 0.2 to 1.0 microns, in combination with other photoresist layers such as a positive novolak resist having a thickness of about 0.1 to 1 microns and a polymethylmethacrylate layer, having a thickness of 1-3 microns.

In instances where polymethylmethacrylates are utilized in the photoresist layer, there can be used, for example, Elvacite ® 2041 and 2010 of the DuPont de Nemours Company, Wilmington, Del.; KTI standard PMMA resist, etc. The PMMA resist can be utilized in combination with an absorbant dye such as the 1,3-propane diol diester of methyl(p-diethylamino-$\alpha$-cyano)-cinnamic acid or coumarin. The PMMA resist layer can be applied onto a substrate such as a silicon substrate or glass substrate in the form of a spin castable mixture, comprising 100 parts of an inert organic solvent, for example, toluene, chlorobenzene, methylisobutylketone, etc., where there can be utilized 100 parts of the organic solvent, 1-15 parts of the PMMA and 0.01-1.0 parts of the absorbant dye.

Among positive photoresist compositions which can be used in the practice of the invention, there are included novolak resins modified with naphthoquinonediazides as shown in the chemical behavior of positive working systems by Jeffrey C. Streeter, Eastman Kodak Company, Proceedings of the Microelectronic Seminar Interface '76, pp. 116-121. A typical reaction for preparing these positive photoresists is to react the hydroxyl groups on a phenol-formaldehyde resin with naphthoquinone-diazide sulfonyl chloride. The most common solvents used in the novolak positive resists are 2-ethoxyethylacetate and 2-methoxyethylacetate. In some cases, xylene and butylacetate can be incorporated into the solvent system to give various drying and coating characteristics.

Spin castable mixtures which can be utilized to form the CEL are more particularly described in copending application Ser. No. 536,923, There can be utilized, for example, a mixture comprising by weight, (A) 100 parts of an organic solvent, (B) 1-30 parts, preferably 5-15 parts of an inert organic polymer binder, and (C) 1-30 parts, preferably 5-15 parts of an aryl nitrone.

Aryl nitrones which can be used in the practice of the method of the present invention to make the photobleachable layer are included by the formula

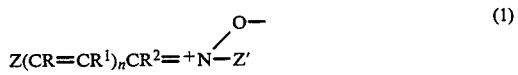

(1)

In formula 1, Z is a monovalent group selected from

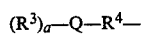

or $R^5$—, and $Z'$ is a monovalent group selected from —$R^6(X)_b$, R, $R^1$, $R^2$ and $R^3$ are monovalent radicals selected from the class of hydrogen, $C_{(1-8)}$ alkyl, $C_{(1-8)}$ substituted alkyl, $C_{(6-13)}$ aryl hydrocarbon and $C_{(6-13)}$ substituted aryl hydrocarbons. Q is a monovalent, divalent or trivalent atom selected from the group F, C, Br, I, O, S, N, where a can have values of 0, 1 or 2. $R^4$ is a $C_{(6-13)}$ aryl hydrocarbon or a $C_{(6-13)}$ substituted aryl hydrocarbon. $R^5$ is selected from the group of substituted or unsubstituted $C_{(6-20)}$ aromatic heterocyclic compounds incorporating one or more atoms from the group O, N or S. $R^6$ is selected from the group of $C_{(6-20)}$ aromatic hydrocarbons and X is selected from the group of halo, cyano, alkyl carbonyl, $C_{(1-8)}$ alkyl, $C_{(1-8)}$ substituted alkyl, $C_{(6-13)}$ aryl hydrocarbon, $C_{(6-13)}$ substituted aryl hydrocarbons, or alkoxy carbonyl in any combination for values of b which can be 0, 1, 2 or 3, n can have a value of 0, 1, 2, 3 or 4. The above compounds can be prepared using procedures such as those described in "Methoden der Organischen Chemie (Houben-Weyl), Vol. 10, part 4 (1968), pages 315–416, or those described in Chemical Reviews 1 (64), Nitrones, by Jan Hamer and Anthony Macaluso, pages 476–483.

Various aryl ring systems with a variety of substituents may be constructed to suit the particular needs of the optical system employed in the photoimaging process. The aryl nitrones exhibit extinction coefficients of 2 to $5 \times 10^4$ liter mole$^{-1}$cm$^{-1}$ and bleach with quantum yields in the range of 0.1 to 0.5.

For direct-step-on-the wafer systems capable of imaging at 405 nm, the following nitrones have been found to be particularly useful,

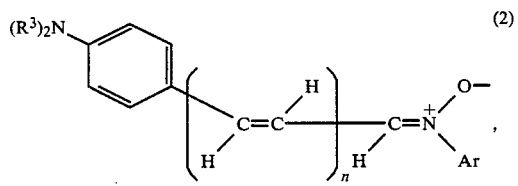

(2)

where Ar is a $C_{(6-13)}$ monovalent aromatic organic radical or substituted $C_{(6-13)}$ monovalent aromatic organic radical and n is equal to 0 to 1. Included among this subclass of p-aminoaryl nitrones, are heterocyclic compounds such as

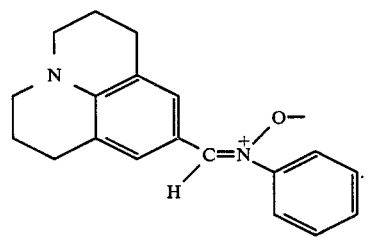

(3)

Suitable binders for use in providing a spin castable mixture for the formation of a photobleachable layer incorporating the aryl nitrones of formula (1) are: vinyl acetate polymers (homopolymers and copolymers) and their partially saponified products (e.g., poly(vinylacetatevinylalcohol), copolymers of styrene or its derivatives, polymers and copolymers of acrylate or methacrylate esters, acetal resins, acrylonitrile/butadiene copolymers, ethyl cellulose and other hydrocarbon-soluble cellulose ethers, cellulose propionate and other hydrocarbon-soluble cellulose esters, poly(chloroprene), poly(ethylene oxide), polyvinylpyrrolidone).

Suitable solvents for use in providing a spin castable mixture to form the photobleachable layer which incorporates the aryl nitrone of formula (1) are: aromatic hydrocarbons (e.g. toluene, xylenes, ethyl benzene, chlorobenzene) with or without aliphatic hydrocarbons (e.g. cyclohexane), halogenated aliphatic compounds (e.g. trichloroethylene, methyl chloroform, alcohols (e.g. propanol, butanol).

Diaryl nitrones of formula 2, where $R^3$ is $CH_3CH_2$— and n=0 have been found to be particularly useful. For example, α-(4-diethylaminophenyl)-N-phenylnitrone, was found to absorb strongly at 405 nm, and it bleaches to near transparency with high efficiency at the same wavelength by undergoing unimolecular cyclization to an oxaziridine. It is very soluble in solvents of moderately low polarity (e.g., toluene, ethylbenzene) and forms good films at high loading densities with a variety of polymers such as polystyrene, poly(hydroxyethylmethacrylate), poly-α-methylstyrene, poly(methylmethacrylate), polyvinylpyrrolidone, vinylpyridine/styrene copolymers and allyl alcohol/styrene copolymers. In addition, α-(4-diethylaminophenyl)-N-phenylnitrone has an extinction coefficient to weight ratio of 130 liters/gram-cm at 405 nm. It can be formed into a contrast enhancing layer by forming a 8% solution in toluene with styrene/allyl alcohol copolymer as a binder.

In the practice of the method of the present invention, a composite photoresist structure can be made by initially spin casting in a conventional manner, a polymethylmethacrylate resin onto a suitable substrate such as a silicon substrate, for example, a silicon wafer, utilizing a solution of the polymethylmethacrylate resin in an organic solvent such as toluene, which also can contain an absorbant dye as previously indicated. There can be used a mixture of 100 parts of the organic solvent, 1–15 parts of the PMMA and 0.01 to 1 part of absorbant dye.

After the PMMA layer has been spun onto the surface of the substrate, it can be baked to a temperature of 140°–200° C. to produce a polymethylmethacrylate resist layer having a thickness of from 1–3 microns. A positive photoresist then can be applied to a thickness of from about 0.1–1.0 microns. The positive photoresist, which can be a novolak resin modified with naphthoquinonediazide utilized in a solvent, such as 2-ethoxyethylacetate or 2-methoxyethylacetate, or in some cases xylene and butylacetate, also can be spun onto the PMMA surface to a thickness of about 0.5 microns. The positive novolak resist then can be baked at a temperature in the range of 70°–90° C. for a period of 1–30 minutes. The contrast enhancement layer can be spun onto the surface of the positive photoresist to a thickness of about 0.2 to 1.0 microns.

Exposure of the photolithographic composite can be accomplished with a mercury arc lamp having an intensity of 100 mw/cm² and a wavelength of from 360–40 nm for a period of from 0.3 to 1 second. The contrast enhancement layer composite photoresist layer can be exposed simultaneously using a printer operating at the appropriate wavelength. The removal of the contrast enhancement layer can be achieved by spraying the CEL with toluene in the form of a mist. The surface of the CEL, for example, can be treated with toluene from an aspirator which has been adjusted to produce a mist. In instances where an immersion technique is appropriate, a mixture of toluene and anisole can be employed utilizing from 15 to 50 parts of anisole per part of toluene. However, if the weight percent of anisole in the anisole toluene mixture is less than 15%, a spray technique is preferred.

In order that those skilled in the art will be better able to practice the invention, the following example is given by way of illustration and not by way of limitation. All parts are by weight.

EXAMPLE 1

Silicon wafers were coated at 5,000 rpm with Shipley 1450B photoresist, which uses a novolak as the base resin, and baked for 7 minutes at 85° C. The resulting silicon wafers coated with red novolak films were then coated with a contrast enhancing layer (CEL) using a solution containing 8% by weight of a α-(4-diethylaminophenyl)-N-phenylnitrone and 8% by weight of an allyl alcohol styrene copolymer in ethyl benzene. The resulting wafers having a yellow CEL coating on their surface were then exposed using an Optimetrix 8010 stepper with a matrix of exposures.

The above coated wafers were then treated with various organic solvents to effect the removal of the yellow CEL layer without substantially altering the red novolak layer. Removal of the CEL layer would be effected if the yellow color of the CEL were eliminated from the surface of the resulting wafer. The appearance of a relief pattern in the red novolak layer would indicate that the solvent treatment had altered the surface characteristics of the novolak layer rendering it unsuitable. In instances where the immersion time of the wafer and the organic solvent exceeded an acceptable limit, partial or complete removal of the novolak from the silicon wafer was observed. Unless otherwise indicated, the wafer was immersed in the organic solvent for a period of about a minute to effect the removal of the CEL. When generating a 20 psi nitrogen gauge pressure on an organic solvent mist there was used a Positive Photoresist Developer of Veeco Instrument Inc., of Plainview, N.Y. A satisfactory removal of the CEL would be shown if the organic solvent treatment did not result in a relief pattern and the novolak resist layer remained substantially intact.

The following results were obtained, where "CEL Removed" means that no trace of the CEL was observable on the silicon wafer, "Relief Pattern Formed" means that there was a clear image of a pattern in the surface of the novolak film as a result of exposure to the UV light and "Resist Removed" means a partial or complete removal of the novolak from the silicon wafer.

| Solvent Systems Examined as CEL Strippers | | | |
|---|---|---|---|
| Solvent | CEL Removed | Relief Pattern Formed | Resist Removed |
| acetonitrile | Y | — | Y |
| n-propanol | Y | — | Y |
| n-butanol | Y | Y | N |
| benzyl alcohol | Y | — | Y |
| dioxane | Y | — | Y |
| acetophenone | Y | — | Y |
| benzyl acetate | Y | — | Y |
| methyl benzoate | Y | — | Y |
| methyl salicylate | Y | Y | N |
| anisole | Y | Y | N |
| xylenes | N | N | N |
| toluene | Y* | N | N |
| 1,1,1-trichloroethane | N | N | N |
| dichloromethane | Y | Y | N |
| trichloroethylene | Y | N | N |
| chlorobenzene | Y | N | N |
| 5% benzyl alcohol/toluene | Y | Y | N |
| 50% n-butanol/toluene | Y | Y | N |
| 5% ethoxyethanol/toluene | Y | Y | N |
| 33% methylethylketone/toluene | Y | — | Y |
| 50% methylisobutylketone/toluene | Y | — | Y |
| 21% methylisobutylketone/toluene | Y | — | Y |
| 10% methylisobutylketone/toluene | Y | Y | N |
| 5% methylisobutylketone/toluene | Y | N | N** |
| 10% methylisobutylketone/trichloroethylene | Y | Y | N |
| 20% cyclohexanone/toluene | Y | Y | N |
| 20% cyclohexanone/trichloroethylene | Y | N | N |
| 5% propylene carbonate/toluene | Y | Y | N** |
| 50% dioxane/trichloroethylene | Y | — | Y |
| 50% dioxane/toluene | Y | Y | N |
| 50% anisole/toluene | Y | Y | N |
| 25% anisole/toluene | Y | N | N |
| 15% anisole/toluene | Y | N | N |
| 5% anisole/toluene | Y* | N | N |

*leaves residue if not sprayed in mist
**resist would not develop

The above results show that with the exception of toluene, or a 5% solution of anisole in toluene which were applied in the form of a mist, or a mixture of anisole and toluene, none of the halogen-free organic solvents were satisfactory for the removal of CEL from the novolak surface.

Although the above example is directed to only a few of the very many variables which can be utilized in the practice of the present invention, it should be understood that the present invention is directed to a method for stripping CEL from various photoresist surfaces utilizing a wider variety of organic solvents, CEL, and photoresists as shown in the description preceding this example.

What I claim as new and desire to secure by Letters Patent of the United States is:

1. A photolithographic stripping method which comprises,
    (1) exposing to patterned UV light, a photoresist comprising a novolak photoresist layer and a contrast enhancement layer adjacent and on the photoresist layer, said contrast enhancement layer comprising aryl nitrone and a styrene/allyl alcohol copolymer, where the contrast enhancement layer provides improved wall profiles and minimizes problems associated with reflections and defraction effects in the resulting exposed photoresist and
    (2) substantially effecting the complete removal of the contrast enhancement layer from the photoresist without substantially altering or removing the photoresist immediately adjacent to the contrast enhancement layer, where the removal of the contrast enhancement layer from the photoresist is effected by spraying the contrast enhancement layer with toluene in the form of a mist, or immersing or spraying the contrast enhancement layer with a mixture of toluene and anisole having less than about 25% by weight of anisole.

2. A method in accordance with claim 1, where the contrast enhancement layer comprises an α-(4-diethylaminophenyl)-N-phenylnitrone and a styrene/allyl alcohol copolymer.

* * * * *